United States Patent [19]

Kobayashi

[11] Patent Number: 4,855,959

[45] Date of Patent: Aug. 8, 1989

[54] DUAL PORT MEMORY CIRCUIT

[75] Inventor: Satoru Kobayashi, Tokyo, Japan

[73] Assignee: NEC Corporation, Tokyo, Japan

[21] Appl. No.: 69,744

[22] Filed: Jul. 6, 1987

[30] Foreign Application Priority Data

Jul. 4, 1986 [JP] Japan .................................. 61-158250

[51] Int. Cl.⁴ ................................................ G11C 8/00
[52] U.S. Cl. ................................ 365/239; 365/189.05; 365/230.05; 365/230.09
[58] Field of Search ................. 365/189, 230, 239, 240, 365/233, 221, 78; 340/750, 799, 800

[56] References Cited

U.S. PATENT DOCUMENTS

| | | | |
|---|---|---|---|
| 4,044,339 | 8/1977 | Berg | 365/240 |
| 4,247,920 | 1/1981 | Springer et al. | 365/230 |
| 4,322,635 | 3/1982 | Redwine | 365/240 |
| 4,433,394 | 2/1984 | Torii et al. | 365/230 |
| 4,644,502 | 2/1987 | Kawashima | 340/800 |

Primary Examiner—Stuart N. Hecker
Assistant Examiner—Glenn A. Gossage
Attorney, Agent, or Firm—Sughrue, Mion, Zinn, Macpeak & Seas

[57] ABSTRACT

An improved dual port memory circuit in which data transfer from the memory array to the data register can be performed without interrupting the serial access in the serial access port is shown. The memory circuit is featured in that first and second transfer circuits are provided between a first half and the second remaining half of the columns, and first and second registers, respectively. One of the transfer circuits which is connected to the non-accessed data register is enabled while serial access to the accessed data register is maintained.

4 Claims, 5 Drawing Sheets

DUAL PORT MEMORY CIRCUIT

BACKGROUND OF THE INVENTION

The present invention relates to a memory circuit and more particularly to a dual port memory circuit.

Random access memories (RAMs) utilizing the LSI technique have been used mainly as the main memories of computers and have come into widespread use in office automation devices, such as personal computers. Due to the remarkable reduction in the cost per bit of storage, MOS random access memories are used for processing video images, especially for displaying images on a CRT. A memory device used with such a display is connected between a CPU and the CRT. However, conventional RAMs are inefficient for display applications. During the display period, the data is sent to the CRT continuously at a high speed data rate such as 45 ns. During this period, the RAM cannot exchange data with the CPU so that the CPU can neither rewrite nor read the content of the RAM. The data exchange between the RAM and the CPU is limited to the blanking period during which no image is displayed on the CRT. As a result, the CPU and the system efficiency is remarkably low.

It has been proposed that RAMs having an input/output system for a CPU and an output system for a CRT are the best suitable for display use. Such RAMs are called "dual port memory".

A known dual port memory is structured such that a serial access port is provided to the known RAM and a serial read operation to the CRT is performed via the serial access port while performing the usual random access operation by the commonly provided random input/output port. The serial access port includes a data register circuit for holding a plurality of data bits, a data transfer circuit for operatively applying a plurality of data bits stored in the selected row of the memory array to the data register circuit, and a serial selection circuit for serially selecting the data bits stored in the data register circuit.

However, the data transfer from the memory array to the data register circuit through the data transfer circuit must be performed in synchronism with the operation of the random access port. Furthermore, such data transfer necessitates a certain time period, and therefore serial access operations over the plurality of rows selected in sequence cannot be achieved at a high speed.

SUMMARY OF THE INVENTION

It is an object of the present invention to provide dual port memory which has a great flexibility in operating its random access port and serial access port.

It is another object of the present invention to provide a dual port memory operable at a high speed in the serial access mode.

The dual port memory circuit according to the present invention is of the type with a memory cell array having memory cells arranged in rows and columns, a random access peripheral circuit for performing random access operations with respect to the memory cell array in response to row and column address information, and a serial access peripheral circuit for serially accessing the columns of the array in response to shift clocks. The above serial access peripheral circuit includes a first transfer circuit provided for a first half of the columns, a second transfer circuit provided for the second, remaining half of the columns, a first data register having a plurality of storage bits coupled to the first transfer circuit, a second data register having a plurality of storage bits coupled to the second transfer circuit, a serial selection circuit for selectively extracting data stored in the first and second data register, and a control circuit for allowing the first transfer circuit to be enabled thereby to transfer data on the first half of digit lines when the serial selection circuit selects the second data register and allowing the second transfer circuit to be enabled thereby to transfer data on the second half of digit lines when the serial selection circuit selects the first data register.

According to the present invention, the two transfer circuits and the two data registers are provided as that simultaneous operation of one of the data transfer circuits and access to one of the data registers can be performed. Therefore, data transfer between the half digit lines to one register circuit can be conducted while the data register coupled to the other transfer circuit is serially accessed.

Thus, limitations in controlling the data transfer and the serial access can be decreased, and a high speed operation can be established.

DETAILED DESCRIPTION OF THE DRAWINGS

DETAILED DESCRIPTION OF THE INVENTION

Figure 1:
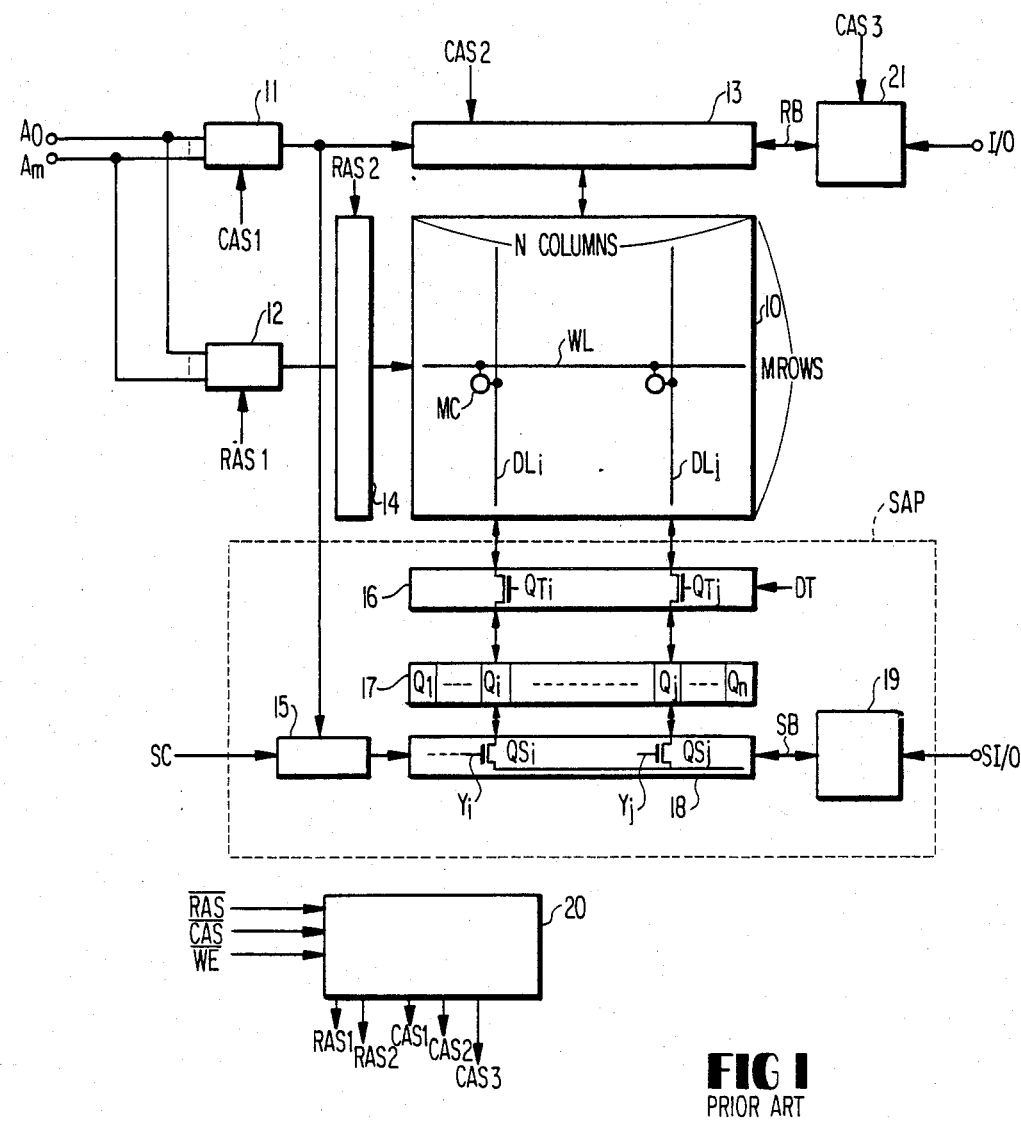
FIG. 1 is a schematic block diagram of a prior art memory circuit.

Referring to FIG. 1, a dual port memory according to the prior art is explained.

The memory comprises a memory cell array 10 having a plurality of memory cells MC, word lines arranged in M rows and digit lines such as $DL_i$, $DL_j$ arranged in N columns, a row address buffer 12, a row decoder 14 for selecting one of the word lines, a column address buffer 11, a column decoder 13 for selecting the column or columns from which read data are extracted, a random I/O circuit 21, and a timing generator 20 for generating timing signals. The above elements are essential to the known random access memory. The dual port memory is featured by a serial access port SAP. The serial access port SAP includes a data register 17 having a plurality of storage bits $Q_1 \ldots Q_n$ of the number N, a data transfer circuit 16 for operatively transferring data between the digit lines and the data register 17 in parallel in response to a data transfer signal DT, a serial selection circuit 18 for selectively performing selective data transfer between a serial bus line SB and the data register 17, a serial address counter 15 for controlling the serial section circuit 18 and a serial input/output (I/O) circuit 19 coupled to a serial input/output terminal SI/O.

Figure 2:
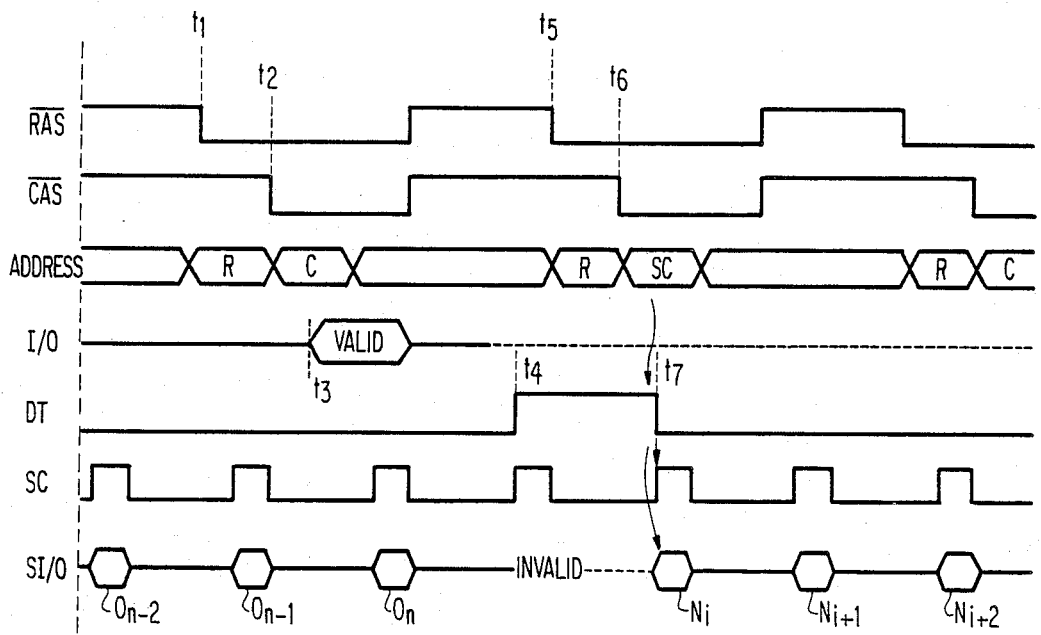
FIG. 2 is a timing diagram showing the operation of the memory of FIG. 1.

Referring to FIG. 2, operation of the memory of FIG. 1 is explained.

A row address strobe signal $\overline{RAS}$ is changed from a high, inactive level to a low, active level at time $t_1$, then the timing generator 20 generates a timing signal RAS1 and thereafter a timing signal RAS2. Thus, the row address buffer 12 holds signals at address terminals $A_0$ to $A_m$ as row address signals (R) in response to RAS1 and the row address decoder selects one of the word lines WL in accordance with the held row address signals in response to RAS2. Thus, data stored in the memory cells coupled to the selected word line are read out to the respective digit lines and amplified by sense amplifiers (not shown) in parallel.

While a column address strobe signal $\overline{CAS}$ is changed from a high, inactive level to a low, active level at time $t_2$, the timing generator 20 generates timing signals CAS1, CAS2 and CAS3 in sequence.

Therefore, the column address buffer 11 incorporates signals at the terminals $A_0$ to $A_m$ as column address signals (C) in response to CAS1, and the column selection circuit 13 selects one or more of the digit lines to be connected to a random access bus line RB. Thereafter, the I/O circuit 21 generates a valid data at the terminal I/O, at time $t_3$. In parallel with the above read cycle, a serial cycle is continued in such manner that data stored in the respective data bits of the data register 17 are sequentially read out by the output of the address counter 15 which is incremented one by one in response to each input of the shift control signal SC, from an initial address determined by the column address signals held by the column address buffer 11 at a data transfer cycle which is described later.

Namely, the counter energizes selection outputs from the above initial address ($Y_k$) towards the end address $Y_n$ via intermediate addresses, e.g. $Y_j$, one by one in sequence in response to SC. Thus, data stored in the bit $Q_k$ in the data register 17 is first transferred to SB via a transfer gate $Q_{sk}$ (not shown) in the circuit 18, and data stored in the bits $Q_{k+1}-Q_{n-2}$, $Q_{n-1}$, $Q_n$ in the data register 17 are sequentially transferred to the bus line SB via the transfer gates $Q_{sk+1}-Q_{sj}-Q_{sn-2}$, $Q_{sn-1}$, $Q_{sn}$ of the selection circuit 18 and outputted at the terminal SI/O as $O_k$, $O_{k+1}$, ... $O_{n-2}$, $O_{n-1}$ and $O_n$.

Explanation is now given to the data transfer cycle.

The data transfer control signal DT is raised to a high, active level at time $t_4$ and the data transfer circuit 16 is enabled, and $\overline{RAS}$ is activated to the low, active level at time $t_5$ so that the row address buffer 12 incorporates row address signals (R) and one word line is selected by the row decoder 14. In this cycle, DT is activated before the activation of $\overline{RAS}$ thereby to identify that the cycle should be the data transfer cycle. Data on the respective digit lines thus obtained are applied to the data register 17 in parallel via the enabled transfer circuit 16. $\overline{CAS}$ is activated to the low active level and the column address buffer 11 incorporates column address signals (SC) for determining the initial column address to be selected first in the serial access port SAP. Thus, the state of the address counter 15 is determined.

The signal DT is disenabled at time $t_7$ in synchronism with the rise of SC to terminate the data transfer cycle and a serial access operation is immediately started from the column address $Y_i$ towards the end address $Y_n$ one by one in synchronism with SC so that data $N_i$, $N_{i+1}$ ... are sequentially produced at the terminal SI/O. However, according to this memory, there is a limitation in applying the signal DT to the memory with respect to $\overline{RAS}$ and SC. Namely, DT must be enabled before $\overline{RAS}$ and the falling edge of DT must be in synchronism with SC. Thus, flexibility in control is very small.

Furthermore, the data transfer cycle performed between $t_4$ to $t_7$ requires a relatively long time and during the data transfer cycle, the serial access operation must be interrupted (invalidated), resulting in a low effective data rate.

Referring to FIGS. 3 to 6, the memory circuit according to one embodiment of the invention is explained.

Figure 3:
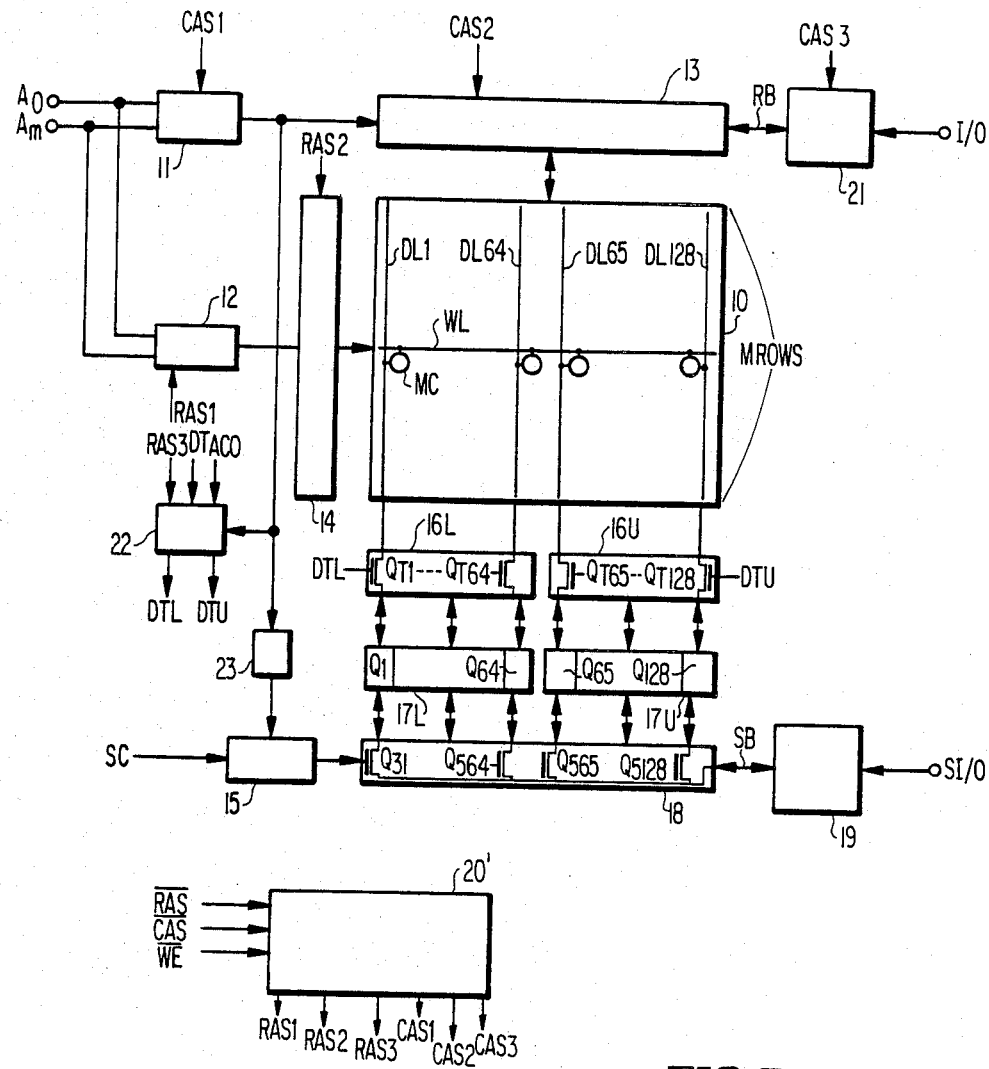
FIG. 3 is a schematic block diagram of the memory according to one embodiment of the invention.

The major structure of the embodiment is shown in FIG. 3, in which the same portions or elements as those in FIG. 1 are designated by the same reference numbers.

As shown in FIG. 3, the present embodiment is obtained by replacing the transfer circuit 16 of FIG. 1 with a lower transfer circuit 16L and an upper transfer circuit 16U, and the transfer circuits 16L and 16U are controlled by different control signals DTL and DTU, respectively which are generated by control circuit 22. The control circuit 22 receives the transfer control signal DT, a most significant column address signal ACO and a timing signal RAS3 which is generated by the timing generator 20' after generation of RAS2. In this embodiment, the number N of the columns is assumed to be 128 for the sake of simplicity, and 128 digit lines are classified into a lower group composed of 64 digit lines $DL_1$ to $DL_{64}$ and an upper group composed 64 digit lines $DL_{65}$ to $DL_{128}$. The lower group is designated by "0" of ACO ($\overline{ACO}=1$) while the upper group is designated by "1" of ACO ($\overline{ACO}=0$).

An address pointer 23 is provided between the column address buffer 11 and the counter and stores information relating to an initial column address in the serial access operation.

In the case where the serial access operation is always started from the digit line $DL_1$, then the pointer 23 is not necessary.

The signal RAS3 is the signal which is generated approximately when data on the respective digit lines are amplified by sense amplifiers (not shown) in the known way.

The lower group of the digit lines $DL_1$ to $DL_{64}$ are connected to the lower transfer circuit 16L and the upper group of digit lines $DL_{65}$ to $DL_{128}$ are connected to the upper transfer circuit 16U. The data register is classified into a lower register 17L and an upper register 17U for the sake of explanation. The lower register 17L includes storage bits $Q_1$ to $Q_{64}$ coupled to the transfer gates $QT_1$ to $QT_{64}$ of the lower transfer circuit 16L respectively. Similarly, the upper register 17U includes storage bits $Q_{65}$ to $Q_{128}$ coupled to the transfer gates $QT_{65}$ to $QT_{128}$ of the upper register 16U, respectively. The selection circuit 18 includes transfer gates $QS_1$ to $QS_{128}$ coupled between the bus line SB and the storage bits $Q_1$ to $Q_{128}$, respectively. The transfer gates $QS_1$ to $QS_{128}$ are sequentially enabled one by one by the address counter 15 in response to SC.

When ACO is at logic "0" and a "1" of DTL is generated with DTU of "0", the lower transfer circuit 16L is enabled thereby to apply or write data on the lower half digit lines $DL_1$ to $DL_{64}$ to the lower register 17L. In this instance, the upper register 17U is allowed to be selected by the counter 15 and data stored in the upper register 17U can be serially read out to SI/O. While, when ACO is at logic "1" and the signal DTU is at logic "1" with DTL of "0", the upper transfer circuit 16U is enabled so that data on the upper half digit lines $DL_{65}$ to $DL_{128}$ are transferred to the upper register 17U. In this instance the lower register 17L is also allowed to be selected by the selection circuit 18 for serial reading.

Therefore, by reading the above operations alternately, one of the lower and upper registers 17L and 17U is subjected to access operations alternately and the remaining register is applied with data alternately. As a result, a continuous serial access operation can be achieved over a plurality of rows e.g. word lines.

Figure 4:
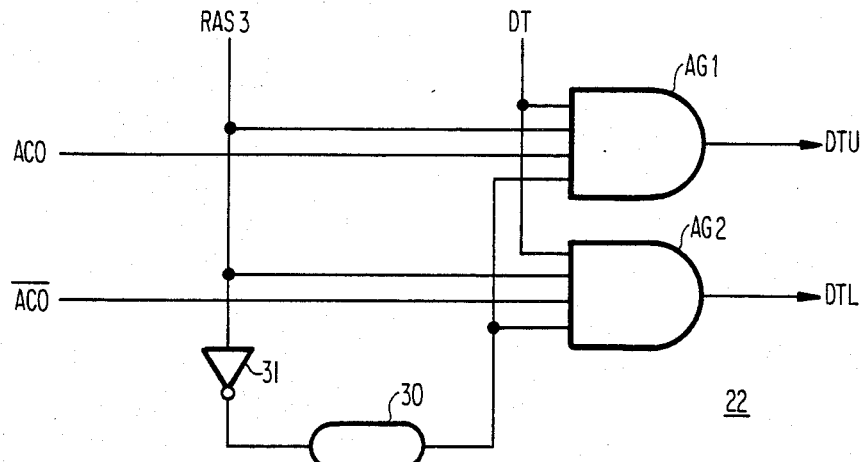
FIG. 4 is a schematic circuit diagram of the control circuit.

One example of the control circuit 22 is shown in FIG. 4. The control circuit 22 includes a delay circuit 30, AND gates AG1 and AG2, and an inverter 31. The inverter 31 and the delay circuit 30 generate an inverted and delayed signal with respect to RAS3. Therefore, RAS3 and the output of the delay circuit 30 condition the gates AG1 and AG2 during a period corresponding to the delay time of the delay circuit 30. Therefore, either signal DTU or DTL has a pulse width of the above period.

Figure 5:
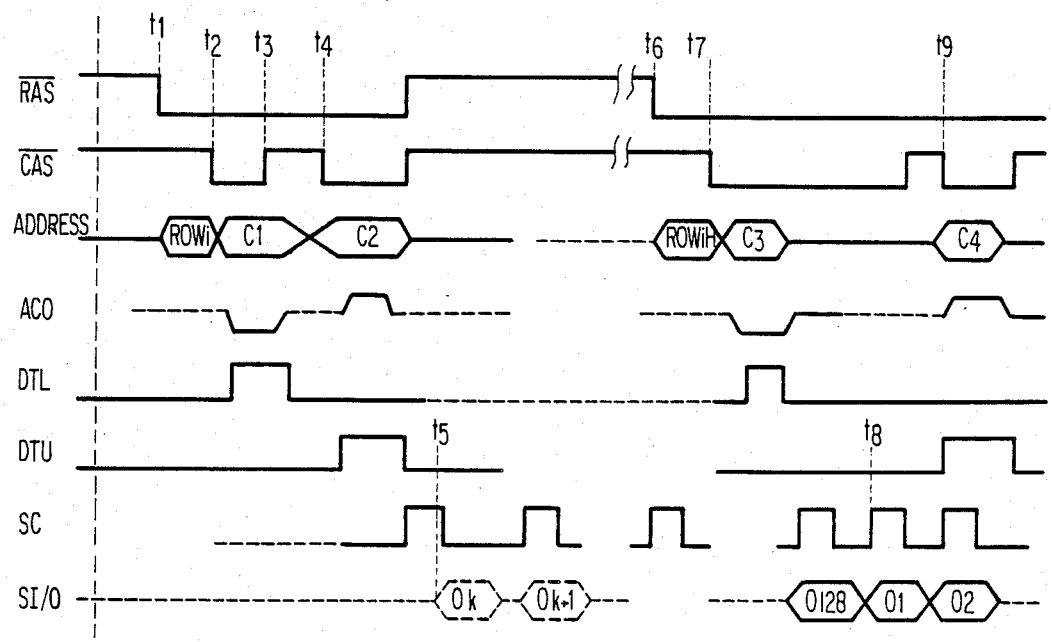
FIG. 5 is a timing diagram of the operation of the memory of FIG. 3.
Figure 6:
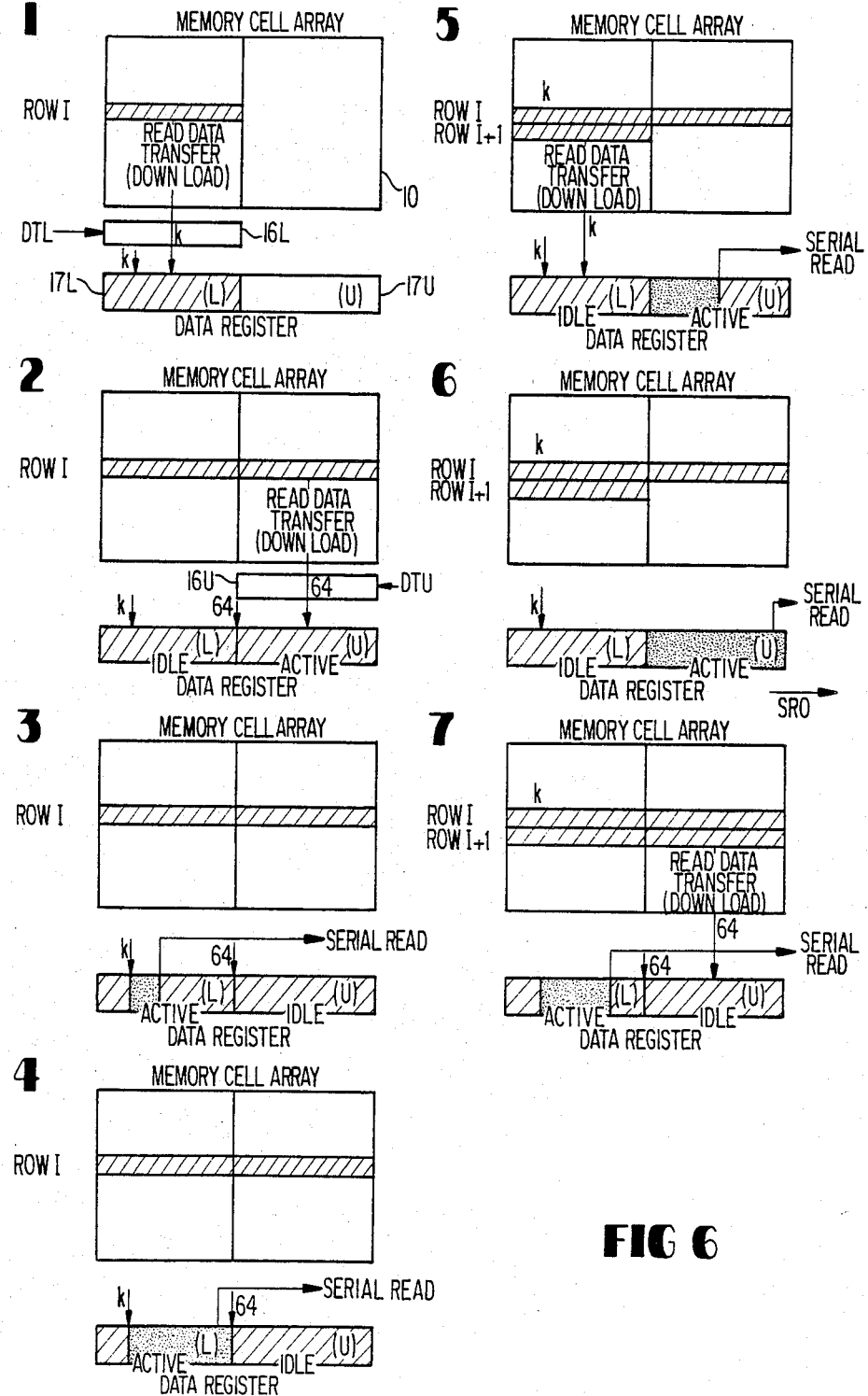
FIG. 6 is a diagram illustrating operational states of the memory of FIG. 3.

Referring to FIGS. 5 and 6, operation of the circuit of FIG. 3 is explained. $\overline{RAS}$ is changed to the low, active level at $t_1$ so that the row address of (Row i) is incorporated and one word line of (Row i) is selected. Then, $\overline{CAS}$ is activated at $t_2$ and column address (C1) with ACO of "0" is incorporated so that DTL is activated with DTU non-activated. Thus, data on the lower half digit lines $DL_1$ to $DL_{64}$ are written to the lower register 17L via the lower transfer circuit 16L and the initial column address K designated by C1 is set in the pointer 23. This operation is illustrated in ① of FIG. 6. Then, $\overline{CAS}$ is deactivated at $t_3$ and again activated at $t_4$ and column address C2 with ACO "1" is taken in so that DTU is activated with DTL of "0". Therefore, data on the upper half digit lines $DL_{65}$ to $DL_{128}$ are transferred to the upper register 17U via the upper transfer circuit 16U. This is illustrated in ② in FIG. 6. Then, a serial read operation is initiated from time $t_5$ from the address K by the counter 15 and the register bits $Q_k, Q_{k+1} \ldots$ are sequentially output as $O_k, O_{k+1} \ldots$ in synchronism with repetition of SC. This step is illustrated at ③ and ④ of FIG. 6. While the serial access is performed on the upper register 17U, $\overline{RAS}$ is activated at $t_6$ and a new row address, e.g. (Row i+1) is incorporated thereby to select the word line of (Row i+1). $\overline{CAS}$ is also activated at $t_7$ and the column address C3 with ACO "0" is taken so that data on the lower half digit lines derived from the row (Row i+1) are transferred to the lower register 17L via the enabled lower transfer circuit 16L and the initial column address (K) is set in the pointer 23. The selection circuit 18 selects the storage bits of the upper register 17U serially, in synchronism with SC towards $Q_{128}$, as illustrated in 5 and 6 of FIG. 6. Then, when the end storage bit $Q_{128}$ is accessed and the output $O_{128}$ is generated at SI/O, the content of the pointer is set in the counter 15 and the counter selects the bit of $Q_k$ at $t_8$ and thereafter $Q_{k+1}, \ldots$ towards $Q_{64}$ in synchronism with SC while $\overline{CAS}$ is again activated at $t_9$ and the column address with ACO of "1" is taken and the transfer circuit 16U transfers the data on the upper half digit line DL65 to DL128 to the upper register 17U in parallel with the serial reading of the lower register 17L, as illustrated ⑥ of FIG. 6.

Thus, by repeating the above operations, data of the digit lines are continuously accessed over a plurality of rows.

As described above, according to the present invention, the data transfer cycle does not affect the serial access operation and it is not seen from outside the RAM. Therefore, there is no limitation in performing the data transfer cycle and a high data rate can be achieved.

I claim:

1. A memory circuit comprising a plurality of row lines, a plurality of column lines crossing said row lines to form a matrix array of rows and columns, said column lines being classified into a first group having first to K-th column lines and a second group having (K+1)-th to N-th column lines (K and N being positive integers of 2 or more and N being larger than K), a plurality of memory cells coupled to said row lines and said column lines, row selection means for operatively selecting one of said row lines thereby to provide said column lines with read signals from the memory cells coupled to the selected row line simultaneously, a first data register having first to K-th storage bits, a second data register having (K+1)-th to N-th storage bits, a first transfer circuit having first to K-th transfer gates coupled between the first to K-th column lines and the first to K-th storage bits, respectively, a second transfer circuit having (K+1)-th to N-th transfer gates coupled between the (K+1)-th to N-th column lines and the (K+1)-th to N-th storage bits, respectively, a serial selection circuit for consecutively selecting said first and second storage registers in an order from the first storage bit to the N-th storage bit one by one thereby to extract data stored in the selected storage bits consecutively, control means coupled to said row selection means for operatively enabling said row selection means at a first time duration and at a second time duration after said first time duration, said row selection means selecting one of said row lines at said first time duration and a different one of said row lines at said second time duration, and a control circuit coupled to said first and second transfer circuits, said transfer circuit enabling the (K+1)-th to N-th transfer gates to transfer circuit derived from the memory cells coupled to said one of the row lines to the (K+1)-th to N-th storage bits in a first time frame when said serial selection circuit selects the first to K-th storage bits consecutively, said control circuit enabling the first to K-th transfer gates to transfer signals derived from the memory cells coupled to said different one of the row lines to the first to K-th storage bits in a second time frame when said serial selection circuit selects the (K+1)-th to N-th storage bits storing signals transferred thereto in said first time frame, whereby data stored in said memory cells coupled to said row lines are sequentially derived one by one.

2. The memory circuit according to claim 1, further comprising a random column selection circuit for operatively selecting one of said column lines thereby to extract a stored signal therefrom in accordance with column address information.

3. The memory circuit according to claim 1, in which said control circuit includes means for receiving a predetermined column address signal which distinguishes said first to K-th column lines and said (K+1) to N-th column lines, and a gate circuit responsive to said predetermined column address signal for enabling one of said first and second transfer circuits.

4. A memory circuit comprising an array of memory cells arranged in rows and columns, said columns being classified into first and second groups, a first data register having storage bits of the same number as the number of the columns of said first group, a second data register having storage bits of the same number as the number of the columns of said second group, a plurality of first transfer gates coupled between the respective columns of said first group and the respective storage bits of said first data register, a plurality of second transfer gates coupled between the respective columns of said second group and the respective storage bits of said second data register, a serial selection circuit for consecutively extracting data stored in the storage bits of said first and second data registers one by one, row selection means for operatively selecting one of said rows, said row selection means selecting one of said rows at a first time point and a different one of said rows at a second time point after said first time point, and a control circuit coupled to said first and second transfer circuits, said transfer circuit enabling said second transfer gates thereby to transfer signals in the first group of columns derived from the memory cells associated with said one of the row lines and the second group of columns to said second data register in a first time frame when said serial selection circuit selects the storage bits of said first data register consecutively, said control circuit enabling said first transfer gates thereby to transfer signals on said first group of columns derived from the memory cells associated with said different one of the row lines and said first group of columns in a second time frame when said serial selection circuit selects storage bits of said second data register storing signals transferred thereto in said first time frame, said control circuit enabling said second transfer gates thereby to transfer signals on said second group of columns derived from the memory cells associated to said second group of columns and said different one of the row lines to said second data register in a third time frame when said serial selection circuit selects the storage bits of said first data register storing signals transferred thereto in said second time frame, said first to third time frames being consecutively defined in this order, whereby data stored in memory cells coupled to a plurality of rows are sequentially derived one by one.

* * * * *

UNITED STATES PATENT AND TRADEMARK OFFICE
CERTIFICATE OF CORRECTION

PATENT NO. : 4,855,959

DATED : August 8, 1989

INVENTOR(S) : Satoru KOBAYASHI

It is certified that error appears in the above-identified patent and that said Letters Patent is hereby corrected as shown below:

Column 5, line 51, delete "5 and 6" and insert --⑤ and ⑥--; page 13, line 11

Signed and Sealed this

Seventeenth Day of July, 1990

Attest:

HARRY F. MANBECK, JR.

Attesting Officer

Commissioner of Patents and Trademarks